(12) United States Patent
Otsu et al.

(10) Patent No.: US 11,296,690 B2
(45) Date of Patent: Apr. 5, 2022

(54) DRIVER CIRCUIT

(71) Applicants: Kabushiki Kaisha Toshiba, Tokyo (JP); Toshiba Electronic Devices & Storage Corporation, Tokyo (JP)

(72) Inventors: Hibiki Otsu, Kanagawa-ken (JP); Shuji Toda, Kanagawa-ken (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/186,089

(22) Filed: Feb. 26, 2021

(65) Prior Publication Data
US 2022/0038088 A1    Feb. 3, 2022

(30) Foreign Application Priority Data
Jul. 29, 2020    (JP) .............................. JP2020-128317

(51) Int. Cl.
| H03K 3/00 | (2006.01) |
| H03K 17/00 | (2006.01) |
| H03K 17/687 | (2006.01) |
| H02M 1/08 | (2006.01) |
| H02M 3/04 | (2006.01) |
| H03K 17/0812 | (2006.01) |

(52) U.S. Cl.
CPC ............... H03K 17/08122 (2013.01); *H03K 2217/0081* (2013.01)

(58) Field of Classification Search
None
See application file for complete search history.

(56) References Cited

U.S. PATENT DOCUMENTS

| 6,429,635 | B2 * | 8/2002 | Okubo | ................... | H02M 3/07 |
|  |  |  |  |  | 323/271 |
| 7,388,422 | B2 * | 6/2008 | Khan | ..................... | H02M 3/07 |
|  |  |  |  |  | 327/112 |
| 7,423,471 | B2 |  | 9/2008 | Ueda |  |
| 7,466,037 | B2 |  | 12/2008 | Takeshita et al. |  |
| 2020/0067501 | A1 |  | 2/2020 | Hayashi |  |

FOREIGN PATENT DOCUMENTS

| JP | 2007-97294 A | 4/2007 |
| JP | 2007-166685 A | 6/2007 |
| JP | 2020-31390 A | 2/2020 |

* cited by examiner

*Primary Examiner* — Kenneth B Wells
(74) *Attorney, Agent, or Firm* — Allen & Overy LLP

(57) ABSTRACT

According to an embodiment, an input-voltage control circuit outputs an input voltage when a control signal is in an enabled state. A backflow prevention circuit includes a first transistor and a first body diode. The first transistor turns on to output the input voltage to the input-voltage control circuit when the control signal is in the enabled state. The first body diode is formed in the first transistor and having an anode connected to the first terminal of the first transistor and a cathode connected to a second terminal of the first transistor. The booster circuit receives the input voltage outputted from the input-voltage control circuit and boosts the input voltage to generates a boosted voltage. The boosted voltage is outputted from the driver circuit and supplied to the control terminal of an external output transistor.

17 Claims, 13 Drawing Sheets

DRIVER CIRCUIT

CROSS REFERENCE TO RELATED APPLICATION

This application is based upon and claims the benefit of priority from the prior Japanese Patent Application No. 2020-128317, filed on Jul. 29, 2020, the entire contents of which are incorporated herein by reference.

FIELD

The embodiments described herein relate to a driver circuit.

BACKGROUND

Various power supply systems applied to industrial and consumer uses include a driver circuit to control the gate terminal of an output MOS transistor. The output MOS transistor is required to have less on-resistance to support up to a large current. An effective technique to decrease the on-resistance of an output MOS transistor is to use a booster circuit to boost an input voltage and apply the boosted voltage to the gate of the output transistor to turn on the output transistor.

In the case of using a booster circuit in a driver circuit, it is required to prevent reverse current from flowing from the booster circuit to the power supply terminal side.

DETAILED DESCRIPTION

Figure 1:
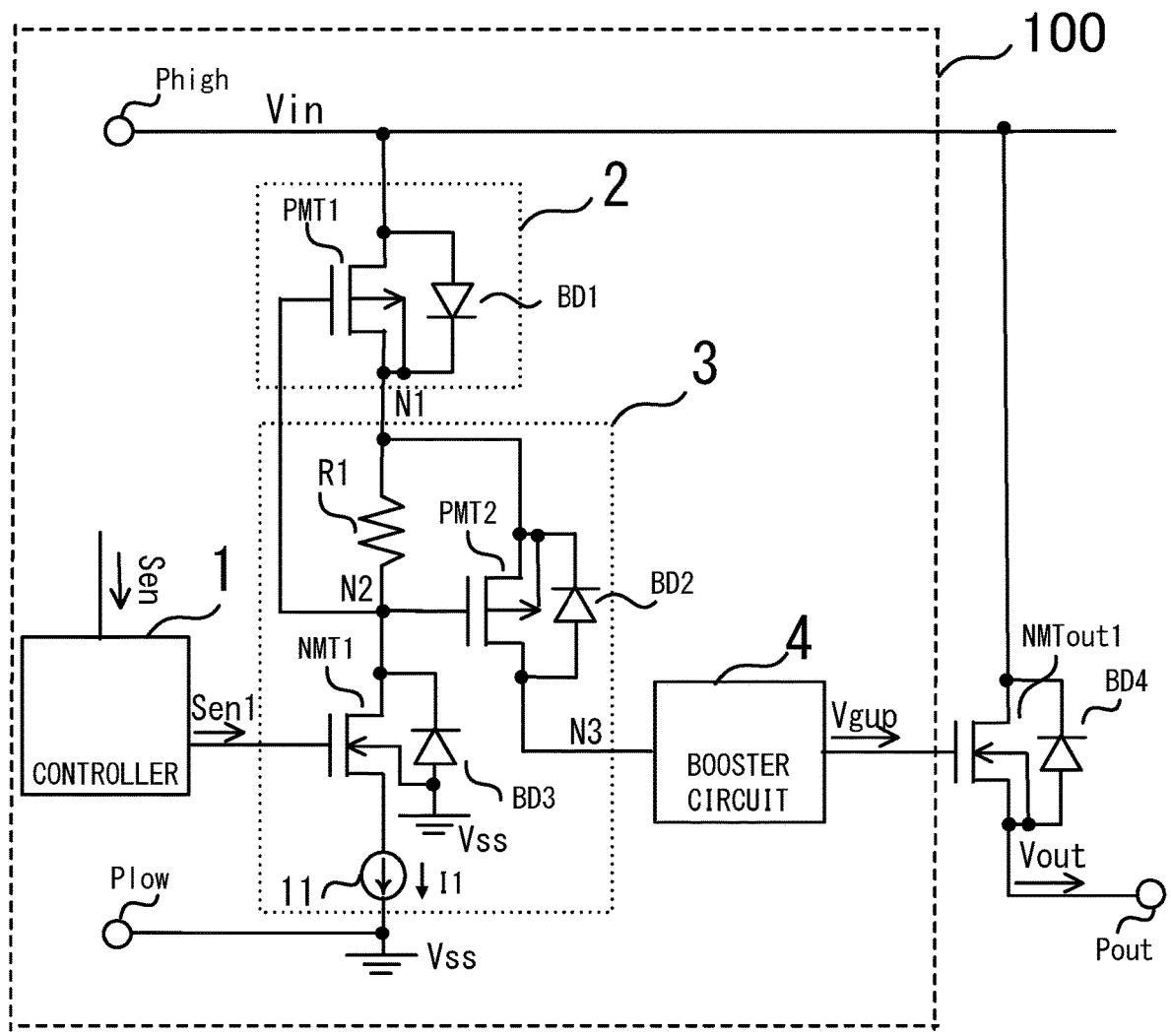
FIG. 1 is a circuit diagram illustrating a driver circuit according to a first embodiment.

According to an embodiment, a driver circuit includes an input-voltage control circuit, a backflow prevention circuit, and a booster circuit. The input-voltage control circuit outputs an input voltage when a control signal is in an enabled state and interrupts the input voltage when the control signal is in a disabled state. The backflow prevention circuit is disposed between a power supply terminal and the input-voltage control circuit. The backflow prevention circuit includes a first transistor having a first terminal to which the input voltage is applied via the power supply terminal, the first transistor being configured to turn on to output the input voltage to the input-voltage control circuit when the control signal is in the enabled state, and turn off when the control signal is in the disabled state, and also includes a first body diode formed in the first transistor and having an anode connected to the first terminal of the first transistor and a cathode connected to a second terminal of the first transistor. The booster circuit receives the input voltage outputted from the input-voltage control circuit and boosts the input voltage to generates a boosted voltage. The boosted voltage is outputted from the driver circuit and supplied to the control terminal of an external output transistor.

Hereinafter, a plurality of embodiments will be further described with reference to the drawings. In the drawings, the same symbols denote the same or similar portions.

A driver circuit according to a first embodiment will be described with reference to drawings. FIG. 1 is a circuit diagram illustrating a driver circuit.

In the first embodiment, an input voltage is supplied via a power supply terminal. When a control signal is in the enabled state, a MOS transistor included in a backflow prevention circuit is on and outputs the input voltage to an input-voltage control circuit. A booster circuit boosts the input voltage outputted from the input-voltage control circuit to generate a boosted voltage and outputs the boosted voltage to the gate of an output transistor. The body diode formed in the MOS transistor included in the backflow prevention circuit has an anode connected to the first terminal of the MOS transistor and a cathode connected to the second terminal of the MOS transistor to prevent a reverse current from flowing from the booster circuit to the power supply terminal side.

As illustrated in FIG. 1, a driver circuit 100 includes a controller 1, a backflow prevention circuit 2, an input-voltage control circuit 3, a booster circuit 4, a terminal Phigh, and a terminal Plow. The driver circuit 100 is applicable to various power supply systems for industrial and consumer uses. In the first embodiment, an output transistor NMTout1, a body diode BD4, and an output terminal Pout are disposed outside the driver circuit 100. However, the invention is not limited to the above case. A driver circuit may have an output transistor NMTout1, a body diode BD4, an output terminal Pout in the inside, for example.

The terminal Phigh is a power supply terminal which receives an input voltage Vin from a power supply, a battery, or the like.

The backflow prevention circuit 2 is disposed between the terminal Phigh (power supply terminal) and the input-voltage control circuit 3 and includes a MOS transistor PMT1 and a body diode BD1.

The MOS transistor PMT1 is a P channel MOS transistor. The MOS transistor PMT1 has a first terminal to which the input voltage Vin is applied via the terminal Phigh (power supply terminal), a control terminal connected to a node N2, and a back gate and second terminal connected to each other and connected to a node N1. The body diode BD1 is a body diode formed in the MOS transistor PMT1 and having an anode connected to the first terminal of the MOS transistor PMT1 and a cathode connected to the second terminal of the MOS transistor PMT1. The MOS transistor PMT1 operates in an on-state (unsaturated operation) in normal operation, and the drain and the source have approximately the same potential because the voltage drop caused by the on-resistance is small. When the MOS transistor PMT1 is off, the body diode BD1 functions as a backflow prevention diode. A MOS transistor is also called a MOSFET.

The controller 1 receives a control signal Sen and outputs a control signal Sen1 to the input-voltage control circuit 3. The operation of the input-voltage control circuit 3 is controlled by the control signal Sen1.

The input-voltage control circuit 3 is disposed between the backflow prevention circuit 2 and the booster circuit 4 and includes a MOS transistor PMT2, a MOS transistor NMT1, a body diode BD2, a body diode BD3, a resistor R1, and a constant-current source 11.

The resistor R1 has one end connected to the node N1 and the other end connected to the node N2 and the control terminal of the MOS transistor PMT1. The MOS transistor PMT2 is a P channel MOS transistor. The MOS transistor PMT2 has a first terminal connected to the node N1, a back gate connected to the first terminal, a control terminal connected to the node N2, and a second terminal connected to a node N3. The body diode BD2 is a body diode formed in the MOS transistor PMT2 and having a cathode connected to the first terminal of the MOS transistor PMT2 and an anode connected to the second terminal of the MOS transistor PMT2.

The MOS transistor NMT1 is an N-channel MOS transistor. The MOS transistor NMT1 is disposed between the node N2 and the constant-current source 11. The MOS transistor NMT1 has a first terminal (drain) connected to the node N2, a control terminal (gate) that receives the control signal Sen1, a back gate connected to a ground potential (low-potential-side power supply) Vss, and a second terminal (source) connected to one end of the constant-current source 11. The body diode BD3 is a body diode formed in the MOS transistor NMT1 and having a cathode connected to the first terminal (drain) of the MOS transistor NMT1 and an anode connected to the back gate of the MOS transistor NMT1 and the ground potential (low-potential-side power supply) Vss. The constant-current source 11 is disposed between the MOS transistor NMT1 and both of the ground potential (low-potential-side power supply) Vss and terminal Plow. The constant-current source 11 provides a constant current I1 to the ground potential (low-potential-side power supply) Vss side. The terminal Plow is also called the ground terminal.

The input-voltage control circuit 3 operates when the control signal Sen1 is in the enabled state (at the high level, for example) and turns on the MOS transistor PMT1 of the backflow prevention circuit 2 to output the input voltage Vin from the node N3 to the booster circuit 4. Specifically, the MOS transistor NMT1 turns on, and the constant current I1 flows through the resistor R1. The voltage at the node N2 decreases by the constant current I1×the resistance value of the resistor R1, and thereby the MOS transistor PMT2 and the MOS transistor PMT1 turn on. The reason why the constant current I1 is used to control the current is to prevent the gate voltage of the MOS transistor PMT1 from falling too much and exceeding the gate breakdown voltage of the MOS transistor PMT1.

The input-voltage control circuit 3 is off when the control signal Sen1 is in the disabled state (at the low level, for example) (the MOS transistor NMT1 is off), which makes the MOS transistor PMT1 of the backflow prevention circuit 2 off and interrupts the input voltage Vin (stops supplying the input voltage Vin to the booster circuit 4).

The booster circuit 4 is a Dickson type booster circuit, for example. Although the booster circuit here is a Dickson type booster circuit, the invention is not limited to the above case. A gate-boosted charge pump circuit or the like, for example, may be used instead.

Figure 2:
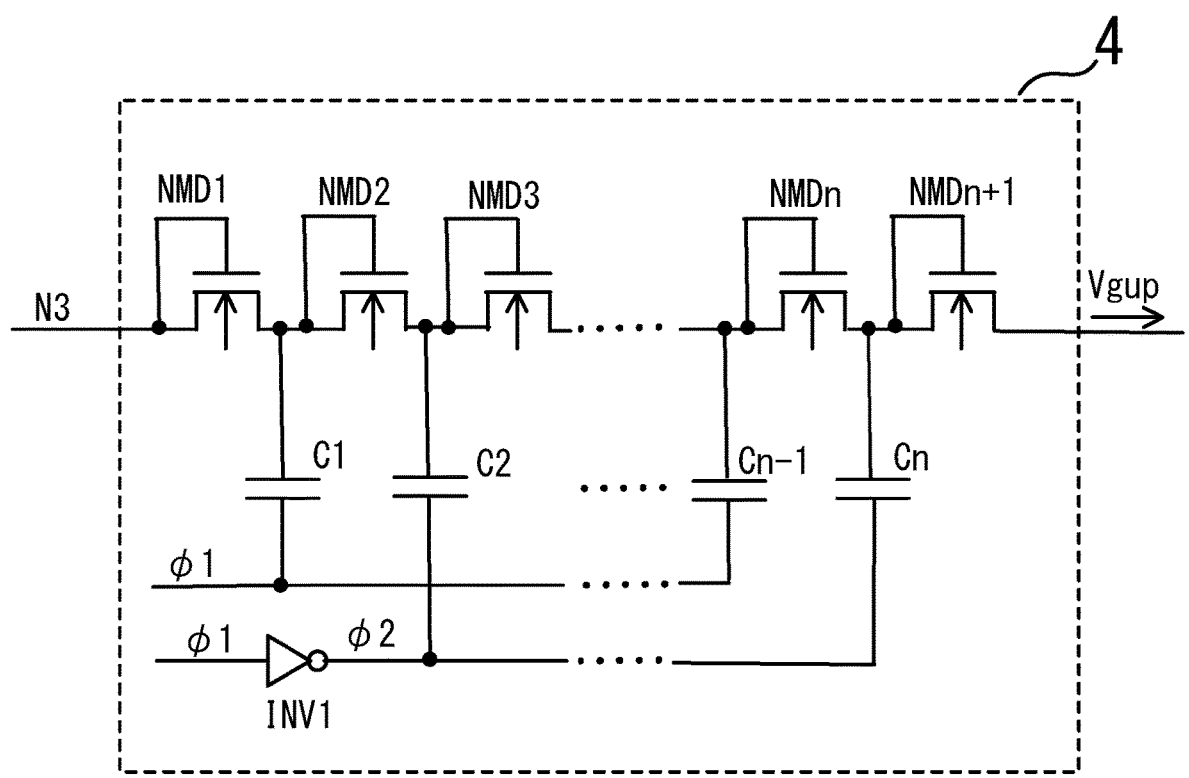
FIG. 2 is a circuit diagram illustrating a booster circuit according to the first embodiment.

As illustrated in FIG. 2, the booster circuit 4 includes MOS transistors NMD1, NMD2, NMD3, NMDn, NMDn+1, capacitors C1, C2, Cn−1, Cn, and an inverter INV1. The MOS transistors NMD1, NMD2, NMD3, NMDn, NMDn+1 are each diode-connected and connected to one another in series (n+1 stages) between the node N3 and the control terminal (gate) of the output transistor NMTout1. The capacitors C1, C2, Cn−1, Cn each have a first end connected between each pair of adjacent ones of the diode-connected MOS transistors. A control signal $\varphi 1$ is inputted to the second ends of the capacitors C1, Cn−1. A control signal $\varphi 2$, which is generated by inverting the control signal $\varphi 1$ with the inverter INV1, is inputted to the second ends of the capacitors C2, Cn.

The booster circuit 4 receives the input voltage Vin outputted from the node N3 of the input-voltage control circuit 3 and generates a boosted voltage Vgup by boosting the input voltage Vin.

The output transistor NMTout1 is an N-channel MOS transistor disposed outside the driver circuit 100. The output transistor NMTout1 has a first terminal (drain) to which the input voltage Vin is applied via the terminal Phigh (power supply terminal), a control terminal (gate) that receives the boosted voltage Vgup, a second terminal (source) connected to the output terminal Pout, and a back gate connected to the second terminal (source). The output transistor NMTout1 turns on based on the boosted voltage Vgup and outputs an output voltage Vout to the output terminal Pout. The body diode BD4 is a body diode formed in the output transistor NMTout1 and having a cathode connected to the first terminal (drain) of the output transistor NMTout1 and an anode connected to the second terminal (source) of the output transistor NMTout1.

The output transistor NMTout1 operates in a non-saturation region (triode region). The drain current Id that flows through the output transistor NMTout1 and the on-resistance (channel resistance) Ron are expressed by the following expressions:

$$Id \approx A \times (Wg/Lg) \times (Vgup - Vth) \times VDS \qquad \text{Expression (1)}$$

$$Ron = VDS/Id \approx Lg/(A \times Wg \times (Vgup - Vth)) \qquad \text{Expression (2)},$$

where Vgup is a boosted voltage applied to the gate of the output transistor NMTout1, Vth is the threshold voltage, Lg is the gate length, Wg is the gate width, VDS is the drain-source voltage, and A is a constant.

Expressions (1) and (2) indicate that as the boosted voltage Vgup boosted by the booster circuit increases, the on-resistance (channel resistance) of the output transistor NMTout1 decreases in inverse proportion to (Vgup−Vth).

The maximum value of the boosted voltage Vgup is limited by the breakdown voltages of the devices included in the driver circuit 100. When the boosted voltage Vgup exceeds a breakdown voltage, a transistor may break down, causing a large current, destroying the devices. It is necessary to consider cases where the booster circuit may generate a high boosted voltage higher than or equal to a specified boosted voltage due to influence from the outside of the driver circuit (influence of the power supply system or other factors, for example).

Figure 13:
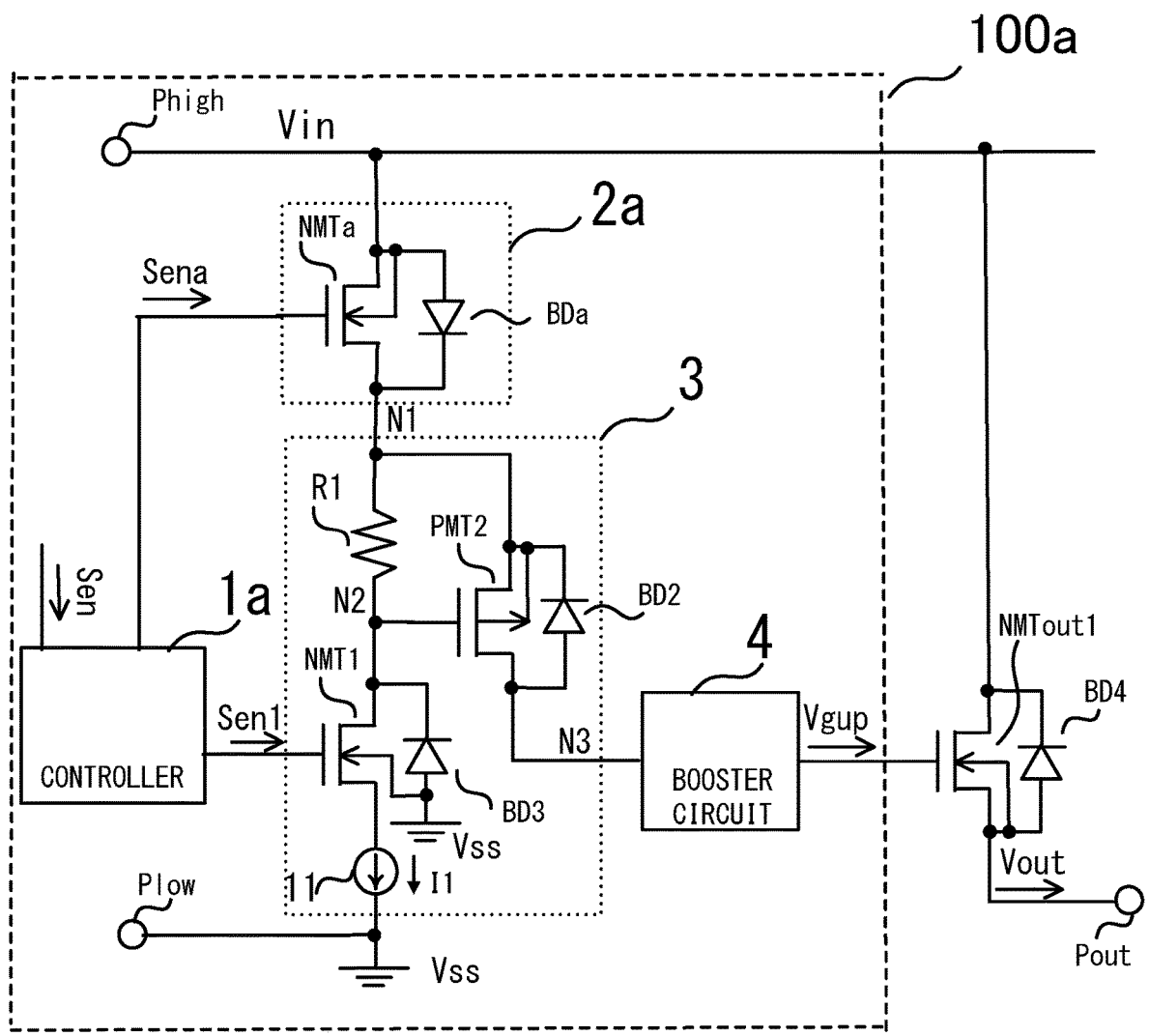
FIG. 13 is a circuit diagram illustrating a driver circuit according to a first modification.

Although the driver circuit 100 of the first embodiment includes the backflow prevention circuit 2, the invention is not limited to the above case. As in a driver circuit 100a of a first modification illustrated in FIG. 13, a backflow prevention circuit 2a may be used instead of the backflow prevention circuit 2.

Specifically, the backflow prevention circuit 2a includes a MOS transistor NMTa and a body diode BDa. The MOS transistor NMTa is an N-channel MOS transistor. The MOS transistor NMTa has a first terminal to which the input voltage Vin is applied via the terminal Phigh (power supply terminal), a back gate connected to the first terminal (source), a second terminal (drain) connected to the node N1, and a control terminal (gate) to which a control signal Sena outputted from a controller 1a is inputted. The MOS transistor NMTa is on when the control signal Sena is in the enabled state (at the high level).

The voltage value of the control signal Sena in the enabled state (at the high level) needs to be set to a value higher than or equal to the input voltage Vin+the threshold voltage Vth. The reason is to decrease the on-resistance and prevent the potential drop between the drain and the source. The body diode BDa is a body diode formed in the MOS transistor NMTa and having an anode connected to the first terminal of the MOS transistor NMTa and a cathode connected to the second terminal of the MOS transistor NMTa. The MOS transistor NMTa operates in an on-state (unsaturated operation) in normal operation, and the drain and the source have approximately the same potential because the voltage drop caused by the on-resistance is small. When the MOS transistor NMTa is off, the body diode BDa functions as a backflow prevention diode.

Figure 3A:
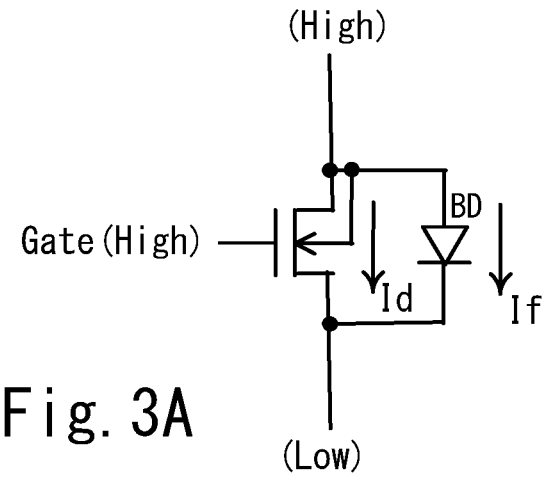
FIG. 3A is a circuit diagram of an N-channel MOS transistor including a forward body diode.
Figure 3B:
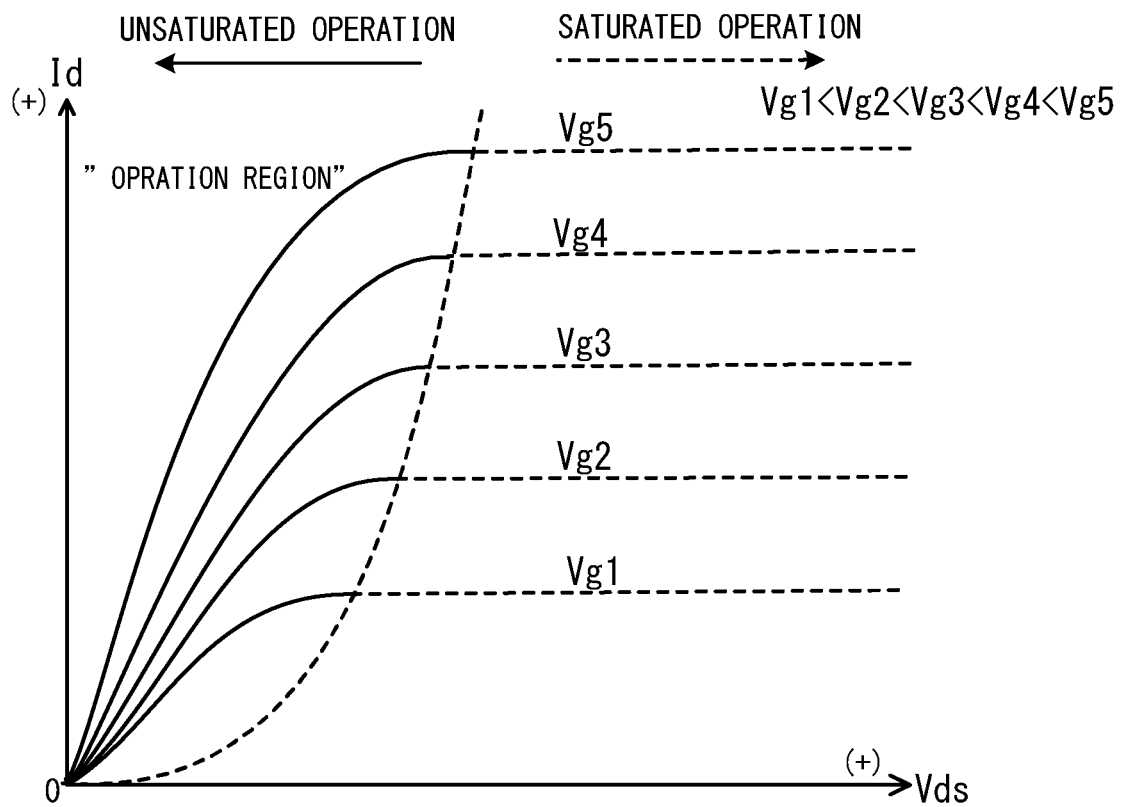
FIG. 3B illustrates operation waveforms of an N-channel MOS transistor including a forward body diode.
Figure 4A:
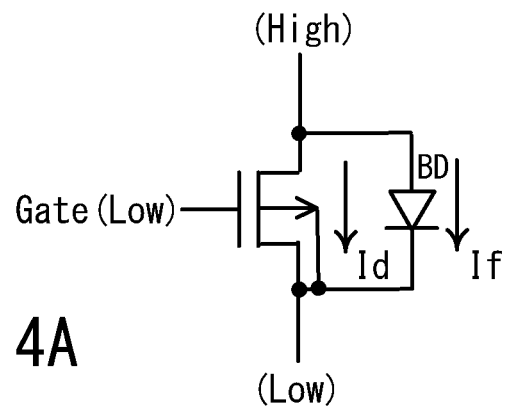
FIG. 4A is a circuit diagram of a P-channel MOS transistor including a forward body diode.
Figure 4B:
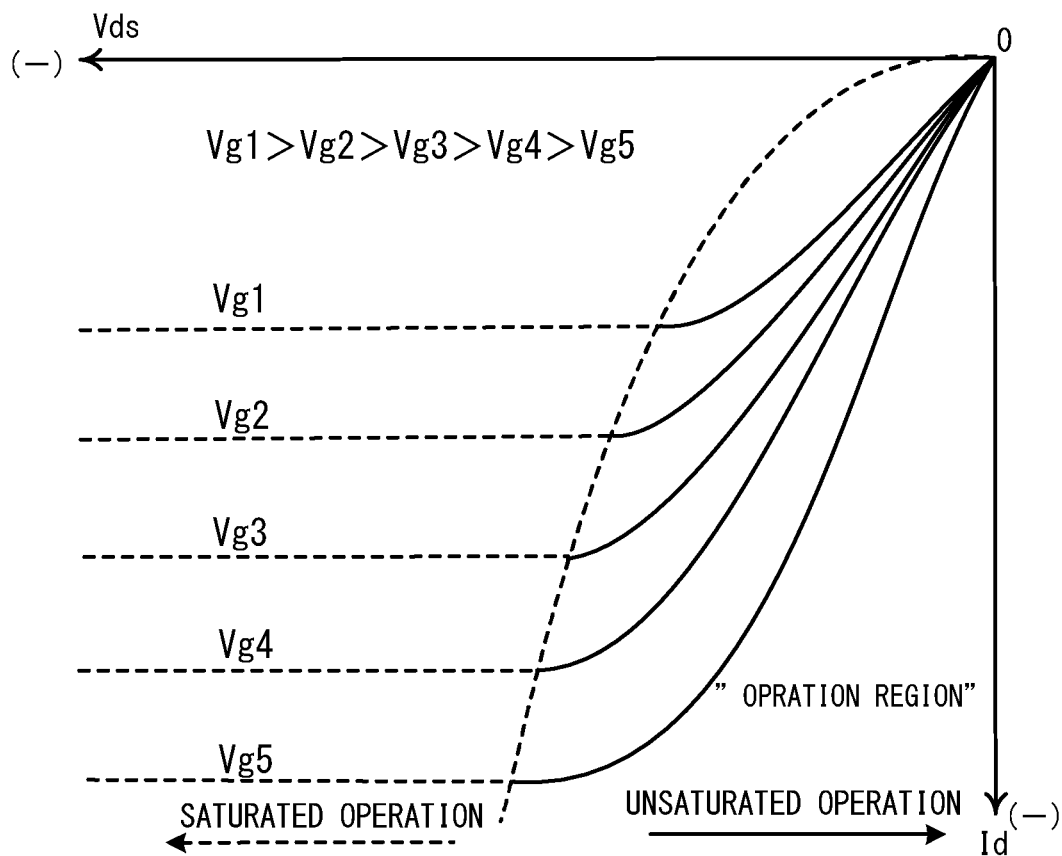
FIG. 4B illustrates operation waveforms of a P-channel MOS transistor including a forward body diode.

The operation of a MOS transistor including a forward body diode will be described with reference to FIGS. 3A, 3B, 4A, and 4B. FIG. 3A is a circuit diagram of an N-channel MOS transistor including a forward body diode, and FIG. 3B illustrates operation waveforms of an N-channel MOS transistor including a forward body diode. FIG. 4A is a circuit diagram of a P-channel MOS transistor including a forward body diode, and FIG. 4B illustrates operation waveforms of a P-channel MOS transistor including a forward body diode.

As illustrated in FIG. 3A, in an N-channel MOS transistor including a forward body diode, when the first terminal is high, the control terminal (gate) is high (higher than the first terminal), and the second terminal is low, a drain current Id flows to the low-potential side. In this operation, the N-channel MOS transistor is on and in a non-saturation region, and the source potential and the drain potential are approximately the same because the voltage difference is only a drop voltage caused by the on-resistance. No current flows through the forward body diode BD between the source and the drain.

For this reason, as illustrated in FIG. 3B, the operation of an N-channel MOS transistor including a forward body diode is limited within the non-saturation region (triode region).

As illustrated in FIG. 4A, in a P-channel MOS transistor including a forward body diode, when the first terminal is high, the control terminal (gate) is low, and the second terminal is low, a drain current Id flows to the low-potential side. In this operation, the P-channel MOS transistor is on and in a non-saturation region, and the source potential and the drain potential are approximately the same because the voltage difference is only a drop voltage caused by the on-resistance. No current flows through the forward body diode BD between the drain and the source.

For this reason, as illustrated in FIG. 4B, the operation of a P-channel MOS transistor including a forward body diode is limited within the non-saturation region (triode region).

The drain current Id of a MOS transistor in the non-saturation region (triode region) is expressed as Expression (3):

$$Id = A \times (Wg/Lg) \times \{((Vg-Vth) \times Vds) - (\tfrac{1}{2})Vds^2\} \quad \text{Expression (3),}$$

where Vg is the voltage applied to the gate of the MOS transistor, Vth is the threshold voltage, Vds is the drain-source voltage, Lg is the gate length, and Wg is the gate width.

Considering $((Vg-Vth) \times Vds) >> (\tfrac{1}{2})Vds^2$, $$Id \approx A \times (Wg/Lg) \times ((Vg-Vth) \times Vds) \quad \text{Expression (4).}$$

Note that A is a constant.

Figure 5:
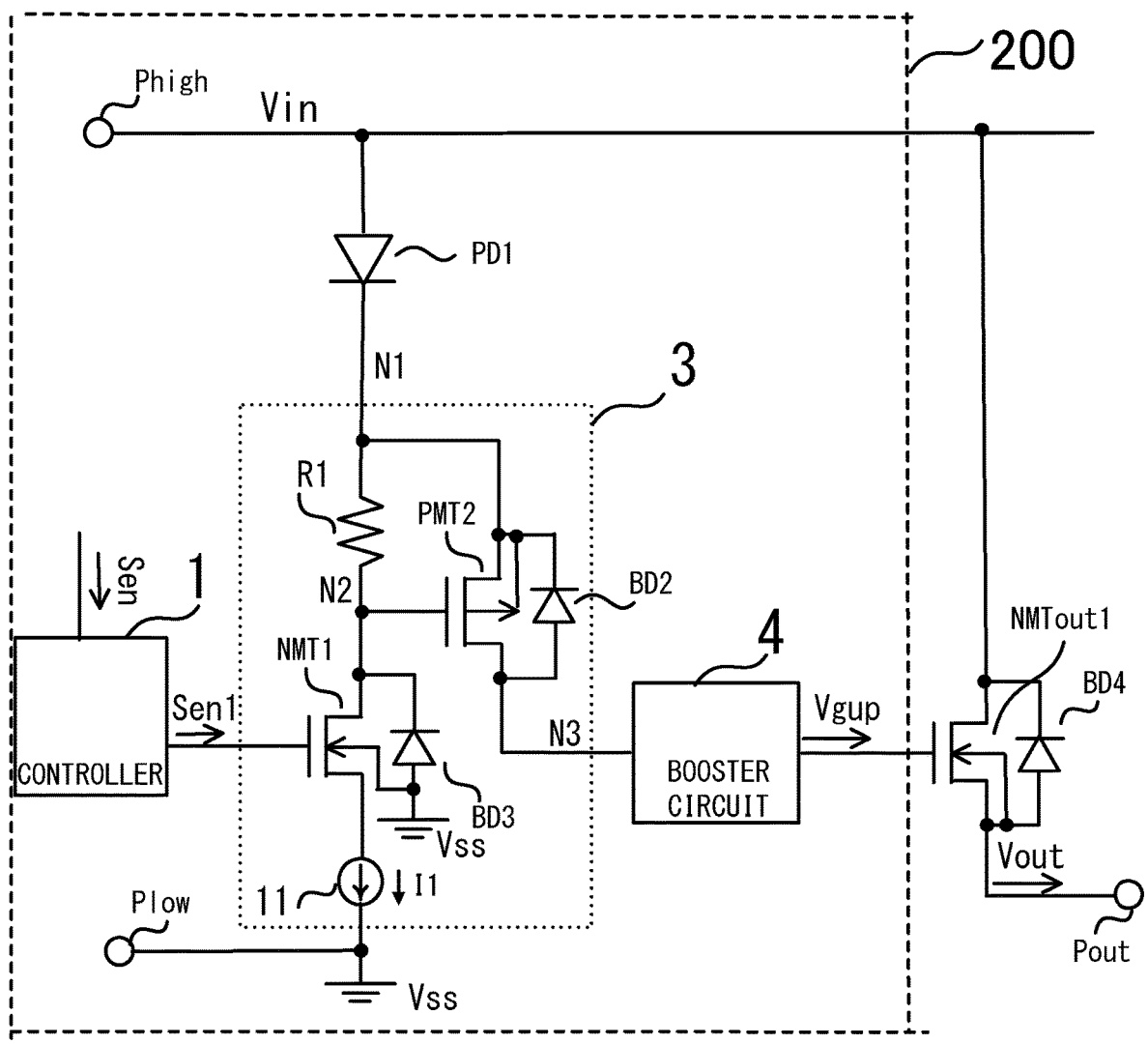
FIG. 5 is a circuit diagram illustrating a driver circuit of a comparative example.

Next, a driver circuit of a comparative example will be described with reference to FIG. 5. FIG. 5 is a circuit diagram illustrating a driver circuit of the comparative example.

As illustrated in FIG. 5, the driver circuit 200 of the comparative example has a diode PD1 instead of the backflow prevention circuit 2 in the driver circuit 100 of the first embodiment. The other portions of the driver circuit 200 of the comparative example are the same as those in the first embodiment, and hence only different points will be described.

The diode PD1 has an anode to which the input voltage is applied via the terminal Phigh (power supply terminal) and a cathode connected to the node N1. When the driver circuit 200 of the comparative example is in normal operation, receiving the control signal Sen1 in the enabled state (at the high level, for example), the direction from the terminal Phigh (power supply terminal) to the node N1 is the forward direction for the diode PD1, a forward-direction current flows toward the node N1, and therefore the voltage at the node N1 is Vin−Vf (a voltage drop has occurred).

When the driver circuit 200 of the comparative example is not operating because the driver circuit is receiving the control signal Sen1 in the disabled state (at the low level, for example), the diode PD1 functions as a reverse-current prevention diode that prevents a reverse current from flowing from the inside of the driver circuit 200 (the booster circuit 4, for example) of the comparative example to the terminal Phigh (power supply terminal).

Figure 6:
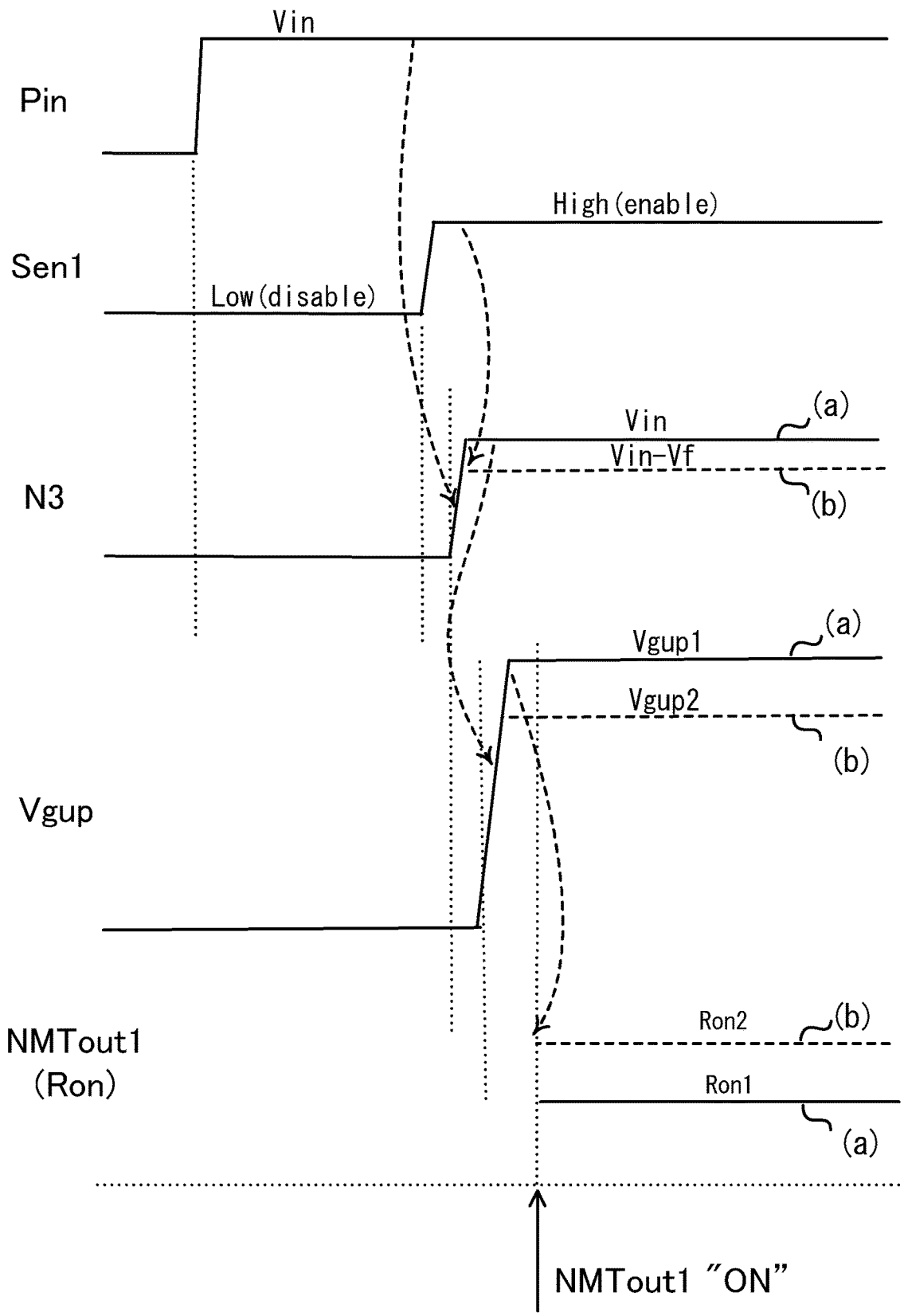
FIG. 6 is a timing chart for explaining the operations of the driver circuits of the first embodiment and the comparative example, in which solid lines (a) show waveforms of the first embodiment, and dashed lines (b) show waveforms of the comparative example.
Figure 7:
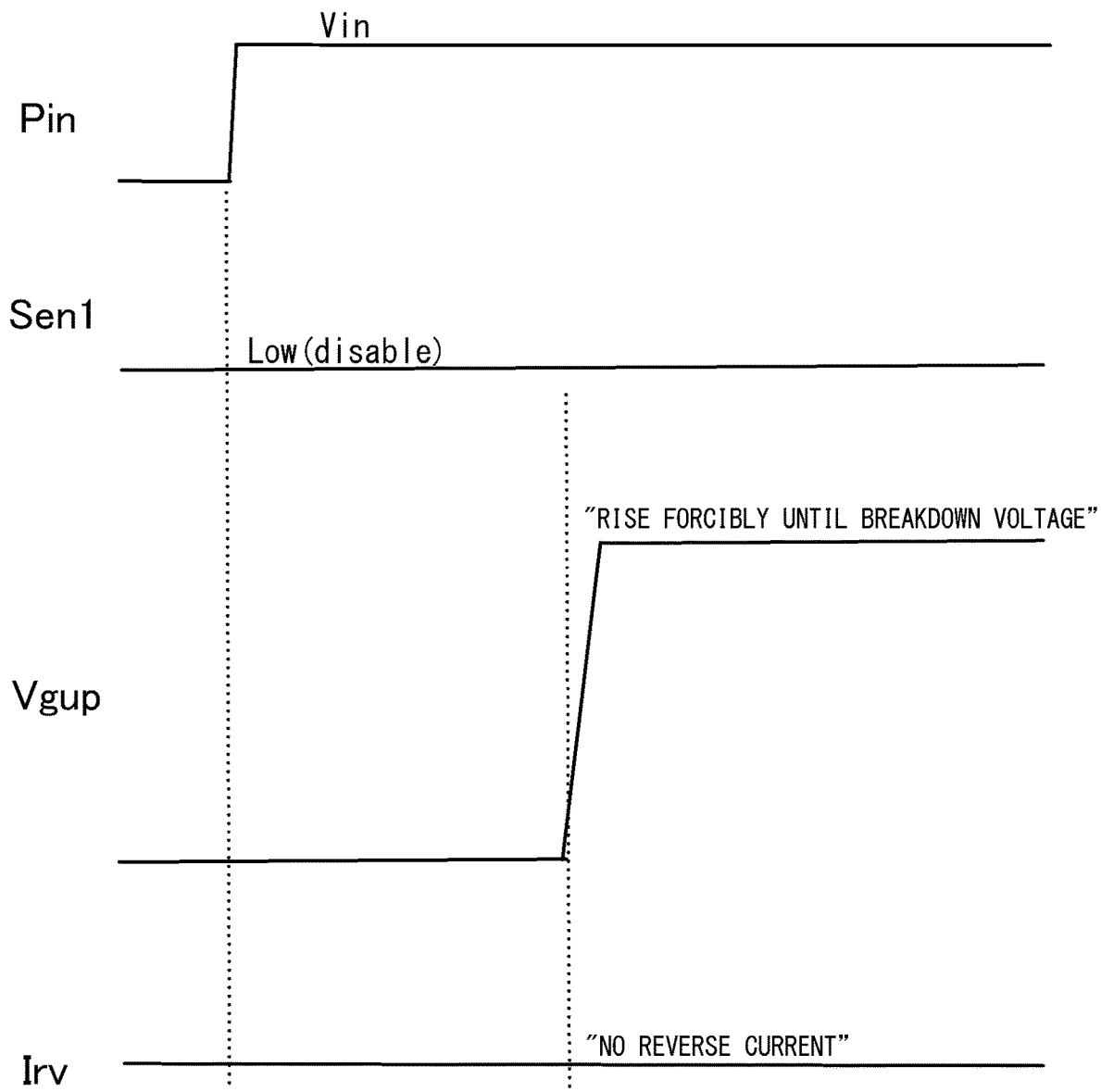
FIG. 7 is a timing chart for explaining an operation for the case where a boosted voltage is forcibly increased to the breakdown voltage.

Next, the operations of the driver circuits of the first embodiment and the comparative example will be described with reference to FIGS. 6 and 7. FIG. 6 is a timing chart for explaining the operations of the driver circuits of the first embodiment and the comparative example. The solid lines (a) show waveforms of the first embodiment, and the dashed lines (b) show waveforms of the comparative example. FIG. 7 is a timing chart for explaining the operation for the case where the boosted voltage is forcibly increased to the breakdown voltage.

As illustrated in FIG. 6, the driver circuit 100 of the first embodiment and the driver circuit 200 of the comparative example receive the input voltage Vin supplied from the outside via the terminal Phigh (electrode terminal). In the subsequent processes, the supply of the input voltage Vin is kept during operation.

Then, the controller 1 outputs the control signal Sen1 in the enabled state (at the high level) to the input-voltage control circuit 3, the input-voltage control circuit 3 starts operating. Since the input voltage Vin does not decrease at the backflow prevention circuit 2 in the driver circuit 100 of the first embodiment, the input voltage Vin is outputted from the node N3 to the booster circuit 4. For the driver circuit 200 of the comparative example, since the input voltage Vin decreases due to the diode PD1, a voltage of Vin−Vf is outputted from the node N3 to the booster circuit 4 (as indicated by a dashed line). For the driver circuit 200 of the comparative example, the voltage at the node N3 is lower than the one in the driver circuit 100 of the first embodiment by Vf.

Next, the booster circuit 4 starts a boosting operation based on the voltage outputted from the node N3 and generates a boosted voltage. For the driver circuit 100 of the first embodiment, the boosted voltage is a boosted voltage Vgup1 (indicated by a solid line) generated by the booster circuit 4. For the driver circuit 200 of the comparative example, the boosted voltage is a boosted voltage Vgup2 (indicated by a dashed line) generated by the booster circuit 4. For the driver circuit 200 of the comparative example, the boosted voltage is lower than the one in the driver circuit 100 of the first embodiment by Vf×the number of stages.

Next, the output transistor NMTout1 receives the boosted voltage outputted from the booster circuit 4 at the control terminal (gate) and turns on (unsaturated operation (triode operation)). For the driver circuit 100 of the first embodiment, the on-resistance Ron1 of the output MOS transistor NMTout1 at the time when the output transistor NMTout1 is operating is expressed as follows (as indicated by a solid line):

$$RON1 \approx Lg/(A \times Wg \times (Vgup1 - Vth)) \quad \text{Expression (5)}.$$

For the driver circuit 200 of the comparative example, the on-resistance Ron2 of the output MOS transistor NMTout1 at the time when the output transistor NMTout1 is on is expressed as follows (as indicated by a dashed line):

$$RON2 \approx Lg/(A \times Wg \times (Vgup2 - Vth)) \quad \text{Expression (6)}.$$

Since the boosted voltage Vgup1>the boosted voltage Vgup2, Ron1<Ron2. Thus, the on-resistance in the driver circuit 100 of the first embodiment is lower than the one in the driver circuit 200 of the comparative example.

With reference to FIG. 7, a description will be given of the case where with the input voltage Vin supplied, the control signal Sen1 in the disabled state (at the low level) is inputted to the input-voltage control circuit 3 (at the time when the driver circuit 100 of the first embodiment and the driver circuit 200 of the comparative example are not operating).

In this condition, in the case where the boosted voltage outputted from the booster circuit is forcibly increased to the breakdown voltage due to influence from the outside of the driver circuit (influence of the power supply system or other factors), both the driver circuit 100 of the first embodiment and the driver circuit 200 of the comparative example can prevent occurrence of a backflow current that would flow from the booster circuit side to the terminal Phigh (power supply terminal). The reason is that for the driver circuit 100 of the first embodiment, the body diode BD1 which is oriented in the reverse direction interrupts current up to the reverse-direction breakdown voltage. For the driver circuit 200 of the comparative example, the diode PD1 which is oriented in the reverse direction interrupts current up to the reverse-direction breakdown voltage.

The driver circuit 100 of the first embodiment, as described above, includes the controller 1, the backflow prevention circuit 2, the input-voltage control circuit 3, the booster circuit 4, the terminal Phigh, and the terminal Plow. The backflow prevention circuit 2 is disposed between the terminal Phigh (power supply terminal) and the input-voltage control circuit 3 and includes the MOS transistor PMT1 and the body diode BD1. The body diode BD1 has an anode connected to the first terminal of the MOS transistor PMT1 and a cathode connected to the second terminal of the MOS transistor PMT1. When the control signal Sen1 is in the enabled state, the input-voltage control circuit 3 operates, the MOS transistor PMT1 is on, and the booster circuit 4 boosts the input voltage Vin and generates the boosted voltage Vgup.

With this configuration, the body diode in the backflow prevention circuit prevents a reverse current from flowing from the booster circuit to the power supply terminal side. The MOS transistor in the backflow prevention circuit makes it possible to directly input the input voltage into the booster circuit without causing a decrease in the input voltage and set the boosted voltage generated at the booster circuit to a high value. Thus, the output transistor operates with a low on-resistance.

Although in the input-voltage control circuit 3 of the first embodiment, the back gate of the MOS transistor NMT1 and the anode of the body diode BD3 are connected to the ground potential (low-potential-side power supply) Vss, the invention is not limited to the above case. The back gate of the MOS transistor NMT1 and the anode of the body diode BD3 may be connected to the second terminal (source) of the MOS transistor NMT1.

Figure 8:
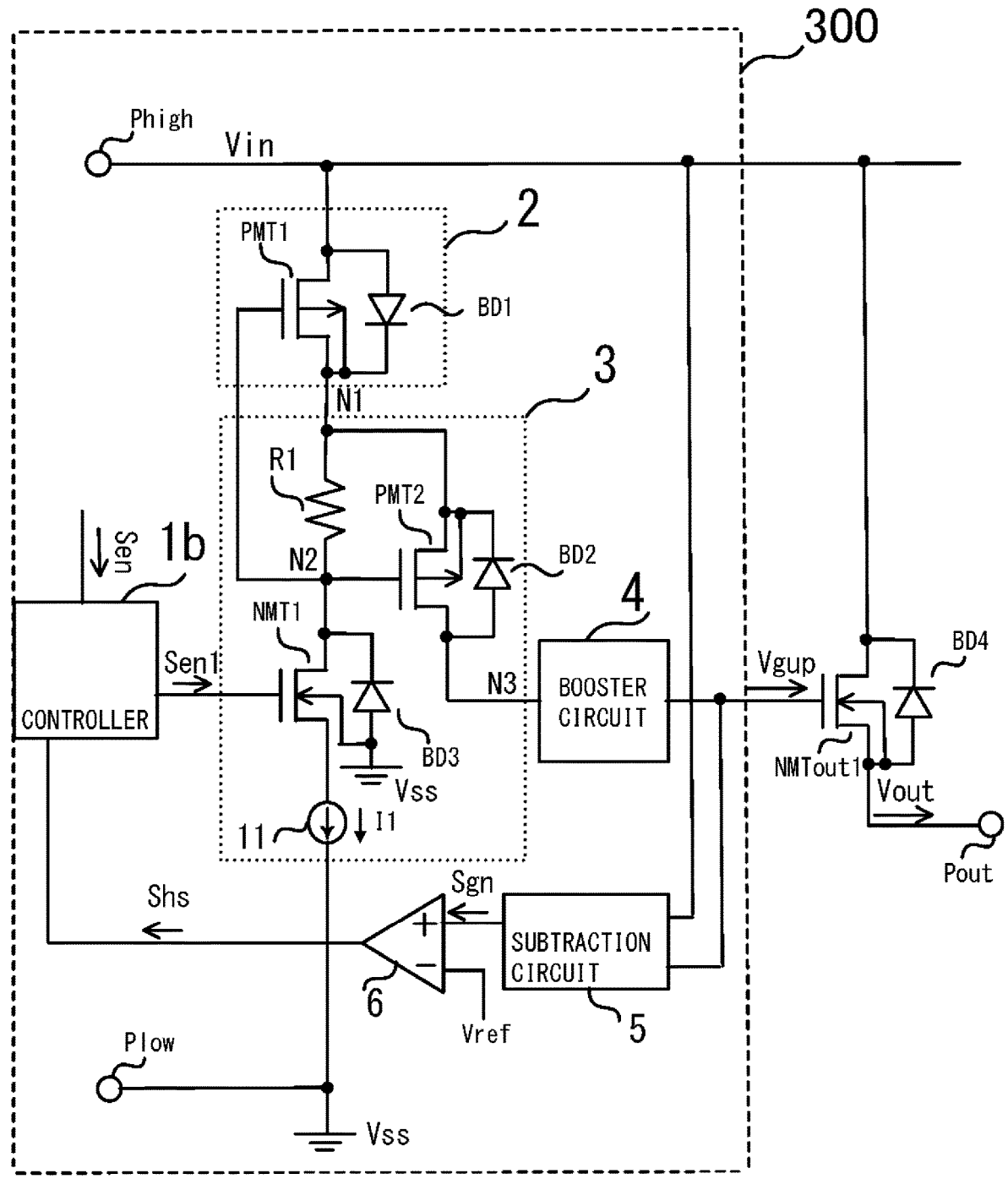
FIG. 8 is a circuit diagram illustrating a driver circuit according to a second embodiment.

Next, a description will be given of a driver circuit according to a second embodiment with reference to drawings. FIG. 8 is a circuit diagram illustrating a driver circuit.

The second embodiment has a subtraction circuit that receives the input voltage and the boosted voltage and performs a subtraction processing and a comparator that receives the subtraction processing voltage and a reference voltage and performs a comparison calculation processing. When the subtraction processing voltage is larger than the reference voltage, the operation of the input-voltage control circuit is stopped.

In the following, the same portions as in the first embodiment are denoted by the same symbols, and description of those portions will be omitted. Only different portions will be described.

As illustrated in FIG. 8, a driver circuit 300 includes a controller 1b, a backflow prevention circuit 2, an input-voltage control circuit 3, a booster circuit 4, a subtraction circuit 5, a comparator 6, a terminal Phigh, and a terminal Plow. The driver circuit 300 is applicable to various power supply systems for industrial and consumer uses.

The subtraction circuit 5 receives the input voltage Vin inputted via the terminal Phigh (power supply terminal) and the boosted voltage Vgup outputted from the booster circuit 4, performs the subtraction processing, and outputs a subtraction signal Sgn which is a subtraction processing voltage.

The comparator 6 receives the subtraction signal Sgn at the plus (+) port on the input side and a reference voltage Vref at the minus (−) port on the input side, performs a comparison calculation processing, and outputs a comparison signal Shs to the control circuit 1b.

The control circuit 1b receives the control signal Sen and the comparison signal Shs and outputs the control signal Sen1 to the input control circuit 3. The control circuit 1b, when the subtraction processing voltage is larger than the reference voltage Vref, switches the control signal Sen from the enabled state (the high level) to the disabled state (the low level) to stop the operations of the input-voltage control circuit 3, the booster circuit 4, and the output transistor NMTout1. The control circuit 1b, when the subtraction processing voltage is smaller than the reference voltage Vref, keeps the control signal Sen in the enabled state (at the high level).

Figure 9:
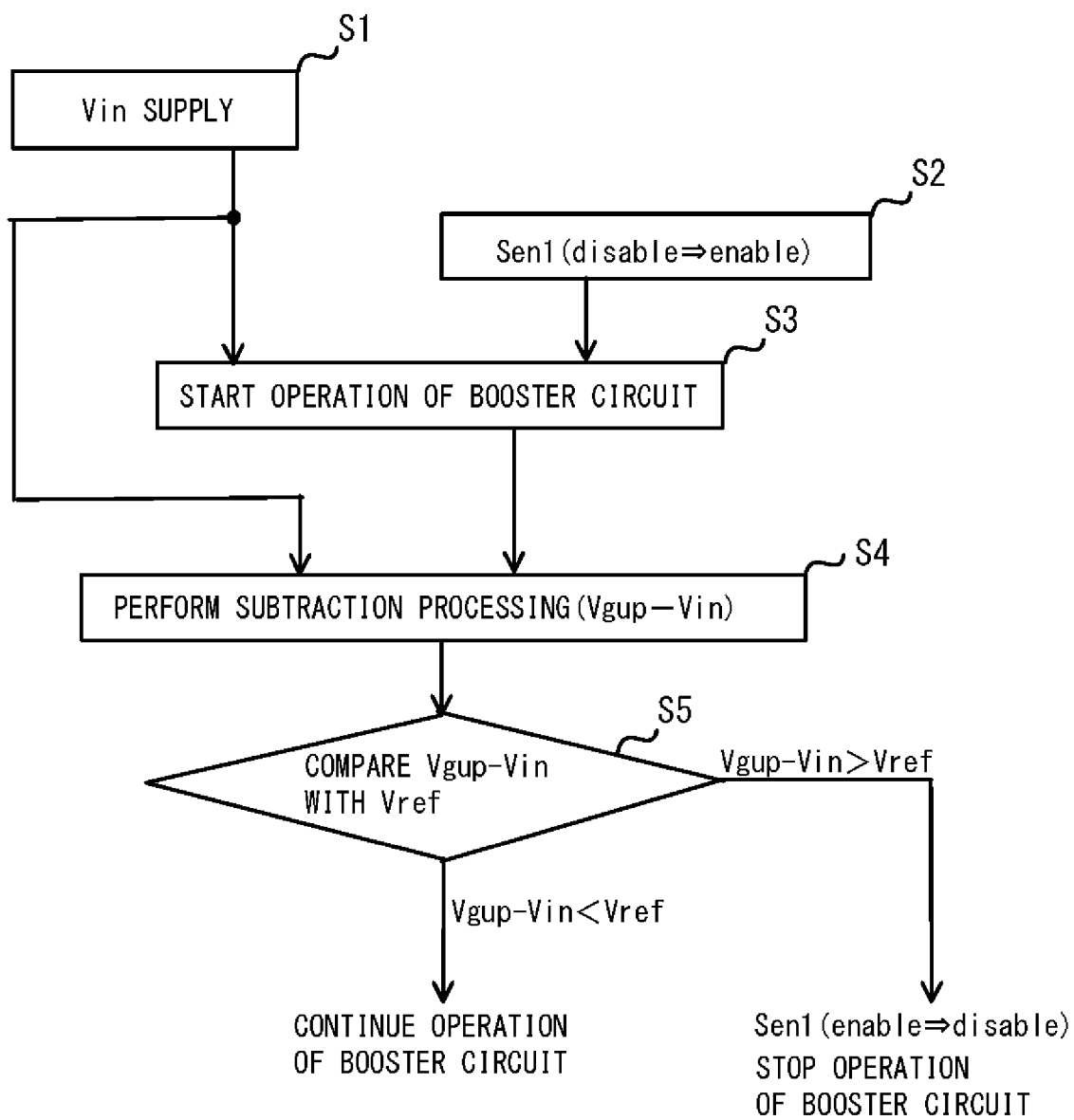
FIG. 9 is a flowchart illustrating the operation of the driver circuit according to the second embodiment.

Next, the operation of the driver circuit 300 will be described with reference to FIG. 9. FIG. 9 is a flowchart illustrating the operation of the driver circuit.

As illustrated in FIG. 9, the driver circuit 300 is supplied with the input voltage via the terminal Phigh (power supply terminal) (step S1).

Then, the control signal Sen1 outputted from the controller 1b to the input-voltage control circuit 3 changes from the disabled state (the low level) to the enabled state (the high level). The control signal Sen1 in the enabled state (at the high level) makes the input-voltage control circuit 3 start operating, turning on the MOS transistor PMT1 of the backflow prevention circuit 2. The input-voltage control circuit 3 outputs the input voltage Vin to the booster circuit 4 (step S2).

Next, the booster circuit 4, receiving the input voltage Vin, starts the boosting operation. The booster circuit 4 outputs the boosted voltage Vgup to the control terminal (gate) of the output transistor NMTout1. The output transistor NMTout1 receives the boosted voltage Vgup at the control terminal (gate), turns on based on the boosted voltage Vgup, and outputs the output voltage Vout to the output terminal Pout (step S3).

Next, while the driver circuit 300 keeps operating, the subtraction circuit 5 receives the input voltage Vin inputted via the terminal Phigh (power supply terminal) and the boosted voltage Vgup outputted from the booster circuit 4 and performs a subtraction processing to output the subtraction signal Sgn (step S4).

The comparator 6 receives the subtraction signal Sgn at the plus (+) port on the input side and the reference voltage Vref at the minus (−) port on the input side and performs a comparison calculation processing to output the comparison signal Shs to the control circuit 1b. The control circuit 1b compares the subtraction processing voltage (Vgup−Vin) with the reference voltage Vref (step S5).

When the control circuit 1b determines that Vgup−Vin is smaller than the reference voltage Vref, the control circuit 1b continues the operation of the booster circuit 4. Specifically, the control circuit 1b determines that no problem has occurred and keeps supplying the control signal Sen1 in the enabled state (at the high level) to the input-voltage control circuit 3.

When the control circuit 1b determines that Vgup−Vin is larger than the reference voltage Vref, the control circuit 1b stops the operation of the booster circuit 4. Specifically, the control circuit 1b determines that the boosted voltage Vgup is being boosted to a voltage larger than or equal to a specified voltage due to influence from the outside (influence from the power supply system or other components), for example, and switches the control signal Sen1 supplied to the input-voltage control circuit 3 from the enabled state (the high level) to the disabled state (the low level) to stop the operations of the input-voltage control circuit 3, the MOS transistor PMT1 of the backflow prevention circuit 2, and the booster circuit 4.

The driver circuit 300 of the second embodiment, as described above, includes the controller 1b, the backflow prevention circuit 2, the input-voltage control circuit 3, the booster circuit 4, the subtraction circuit 5, the comparator 6, the terminal Phigh, and the terminal Plow. During the operation of the driver circuit 300, the subtraction circuit 5 receives the input voltage Vin and the boosted voltage Vgup and performs the subtraction processing. The comparator 6 receives the subtraction result of the subtraction circuit 5 and the reference voltage Vref and performs the comparison calculation processing. The controller 1b receives the comparison signal Shs outputted from the comparator 6. When the controller 1b determines that Vgup−Vin is larger than the reference voltage Vref, the controller 1b stops the operations of the input-voltage control circuit 3, the MOS transistor PMT1 of the backflow prevention circuit 2, and the booster circuit 4.

With the above operation, the second embodiment not only provides the same effect as in the first embodiment but also is capable of stopping the operation of the driver circuit promptly when the boosted voltage Vgup generated by the booster circuit 4 exceeds a specified voltage value.

Figure 10:
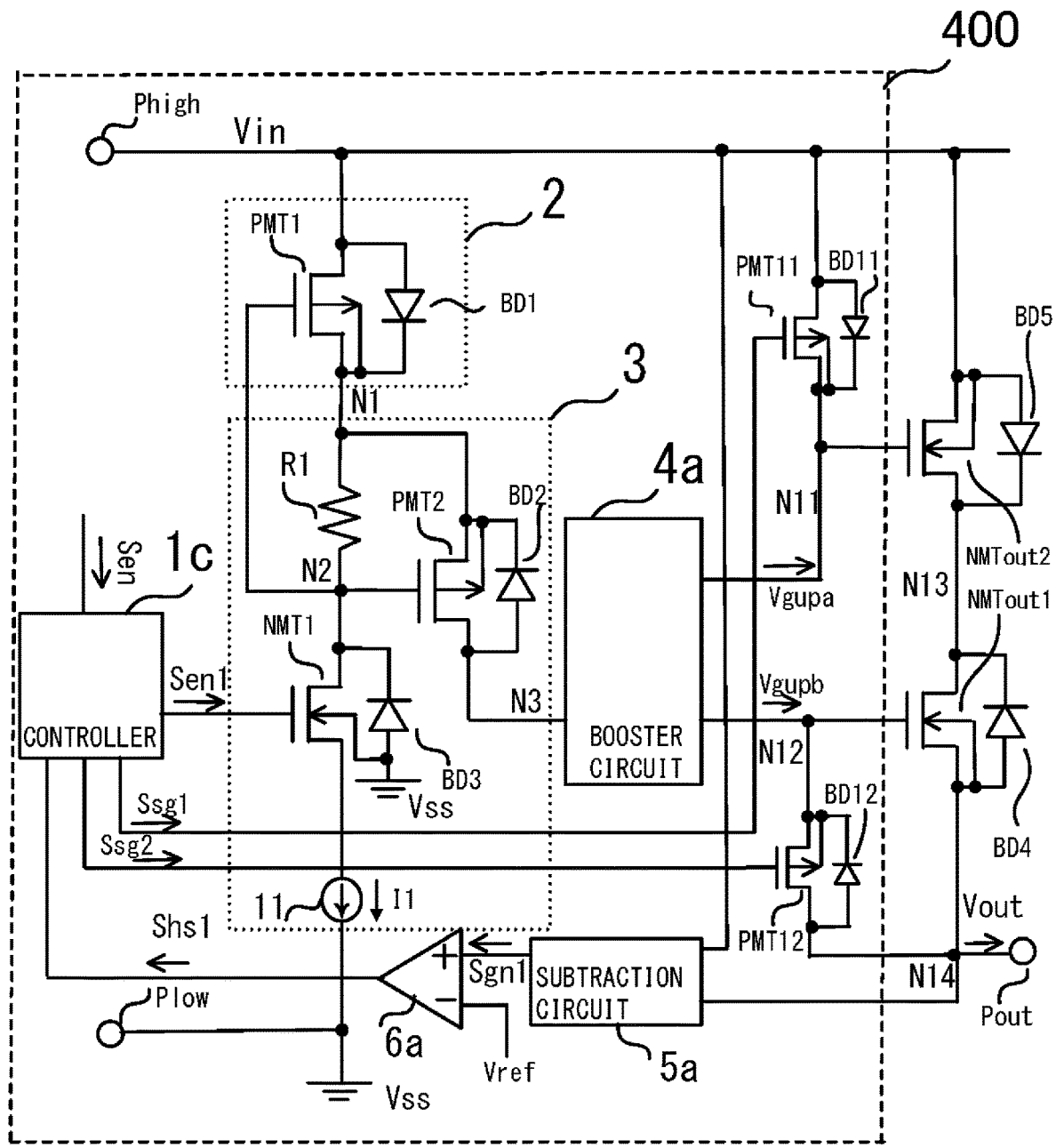
FIG. 10 is a circuit diagram illustrating a driver circuit according to a third embodiment.

Next, a driver circuit according to a third embodiment will be described with reference to drawings. FIG. 10 is a circuit diagram illustrating a driver circuit.

The driver circuit of the third embodiment includes first and second output transistors connected to each other in series, and a first body diode included in the first output transistor and a second body diode included in the second output transistor have a back-to-back structure. The driver circuit also includes a subtraction circuit that receives the input voltage and the output voltage and performs a subtraction processing and a comparator that receives the subtraction processing voltage and a reference voltage and performs a comparison calculation processing. When the subtraction processing voltage is larger than the reference voltage, the driver circuit stops the operation of the input-voltage control circuit.

In the following, the same portions as in the first embodiment are denoted by the same symbols, and description of those portions will be omitted. Only different portions will be described.

As illustrated in FIG. 10, a driver circuit 400 includes a controller 1c, a backflow prevention circuit 2, an input-voltage control circuit 3, a booster circuit 4a, a subtraction circuit 5a, a comparator 6a, a MOS transistor PMT11, a MOS transistor PMT12, a body diode BD11, a body diode BD12, a terminal Phigh, and a terminal Plow. The driver circuit 400 is applicable to various power supply systems for industrial and consumer uses.

In the third embodiment, the output transistor NMTout1, an output transistor NMTout2, a body diode BD4, a body diode BD5, and the output terminal Pout are disposed outside the driver circuit 400. However, the invention is not limited to the above case. The driver circuit may have an output transistor NMTout1, an output transistor NMTout2, a body diode BD4, a body diode BD5, and an output terminal Pout in the inside, for example.

The booster circuit 4a receives the input voltage Vin outputted from the input-voltage control circuit 3 and performs the boosting operation to generate a boosted voltage Vgupa and a boosted voltage Vgupb. Here, the boosted voltage Vgupa and the boosted voltage Vgupb may have the same voltage value or different voltage values. The configuration is not limited to any specific one.

The output transistor NMTout2 is an N-channel MOS transistor. The output transistor NMTout2 has a first terminal to which the input voltage Vin is applied via the terminal Phigh (power supply terminal, a control terminal to which the boosted voltage Vgupa is applied, a back gate connected to the first terminal, a second terminal connected to a node NIB and turns on based on the boosted voltage Vgupa. The body diode BD5 is a body diode formed in the output transistor NMTout2 and having an anode connected to the first terminal of the output transistor NMTout2 and a cathode connected to the second terminal of the output transistor NMTout2.

The output transistor NlvlTout1 is an N-channel MOS transistor. The output transistor NMTout1 has a first terminal connected to the node Nm (the second terminal of the output transistor NMTout2), a control terminal to which the boosted voltage Vgupb is applied, and a back gate and second terminal connected to each other. The output transistor NMTout1 turns on based on the boosted voltage Vgupb and outputs the output voltage Vout to the output terminal Pout. The body diode BD4 is a body diode formed in the output transistor NMTout1 and having a cathode connected to the first terminal of the output transistor NM Tout 1 and an anode connected to the second terminal of the output transistor NMTout1.

The body diode BD5 and the body diode BD4 form a back-to-back structure in which the cathodes are opposed to each other. With this structure, when the output transistor NMTout2 and the output transistor NMTout1 are off, and the voltage difference between the terminal Phigh (power supply terminal) and the output terminal Pout is larger than or equal to a specified voltage, the body diode BD5 and the body diode BD4 interrupt current between the terminal Phigh (power supply terminal) and the output terminal Pout (current interruption of the reverse voltage resistance of the diodes).

The subtraction circuit 5a receives the input voltage Vin inputted via the terminal Phigh (power supply terminal) and the output voltage Vout, performs a subtraction processing, and outputs a voltage from the subtraction processing, called a subtraction signal Sgn1.

The comparator 6a receives the subtraction signal Sgn1 at the plus (+) port on the input side and the reference voltage Vref at the minus (−) port on the input side and performs a comparison calculation processing to output a comparison signal Shs1 to a control circuit 1c.

The control circuit 1c receives the control signal Sen and the comparison signal Shs1 and outputs the control signal Sen1, a control signal Ssg1, and a control signal Ssg2.

The MOS transistor PMT11 is a P-channel MOS transistor. The MOS transistor PMT11 has a first terminal to which the input voltage Vin is applied via the terminal Phigh (power supply terminal), a control terminal which receives the control signal Ssg1 outputted from the control circuit 1e, a back gate and second terminal connected to each other, and the second terminal is connected to a node N11 (the control terminal of the output transistor NMTout2 and the boosted voltage Vgupa). When the control signal Ssg1 is in the enabled state (at the low level, for example), the MOS transistor PMT11 turns on and forcibly sets the voltage of the node N11 to the input voltage Vin level. The body diode BD11 is a body diode formed in the MOS transistor PMT11 and having an anode connected to the first terminal of the MOS transistor PMT11 and a cathode connected to the second terminal of the MOS transistor PMT11.

The MOS transistor PMT12 is a P-channel MOS transistor. The MOS transistor PMT12 has a first terminal connected to a node N12 (the control terminal of the output transistor NMTout 1 and the boosted voltage Vgupb), a back gate connected to the first terminal, a control terminal which receives the control signal Ssg2 outputted from the controller 1e, and a second terminal connected to a node N14 and the output terminal Pout. When the control signal Ssg2 is in the enabled state (at the low level, for example), the MOS transistor PMT12 turns on and forcibly sets the voltage of the node N12 to the output voltage Vout level. The body diode BD12 is a body diode formed in the MOS transistor PMT12 and having a cathode connected to the first terminal of the MOS transistor PMT12 and an anode connected to the second terminal of the MOS transistor PMT12.

Figure 11:
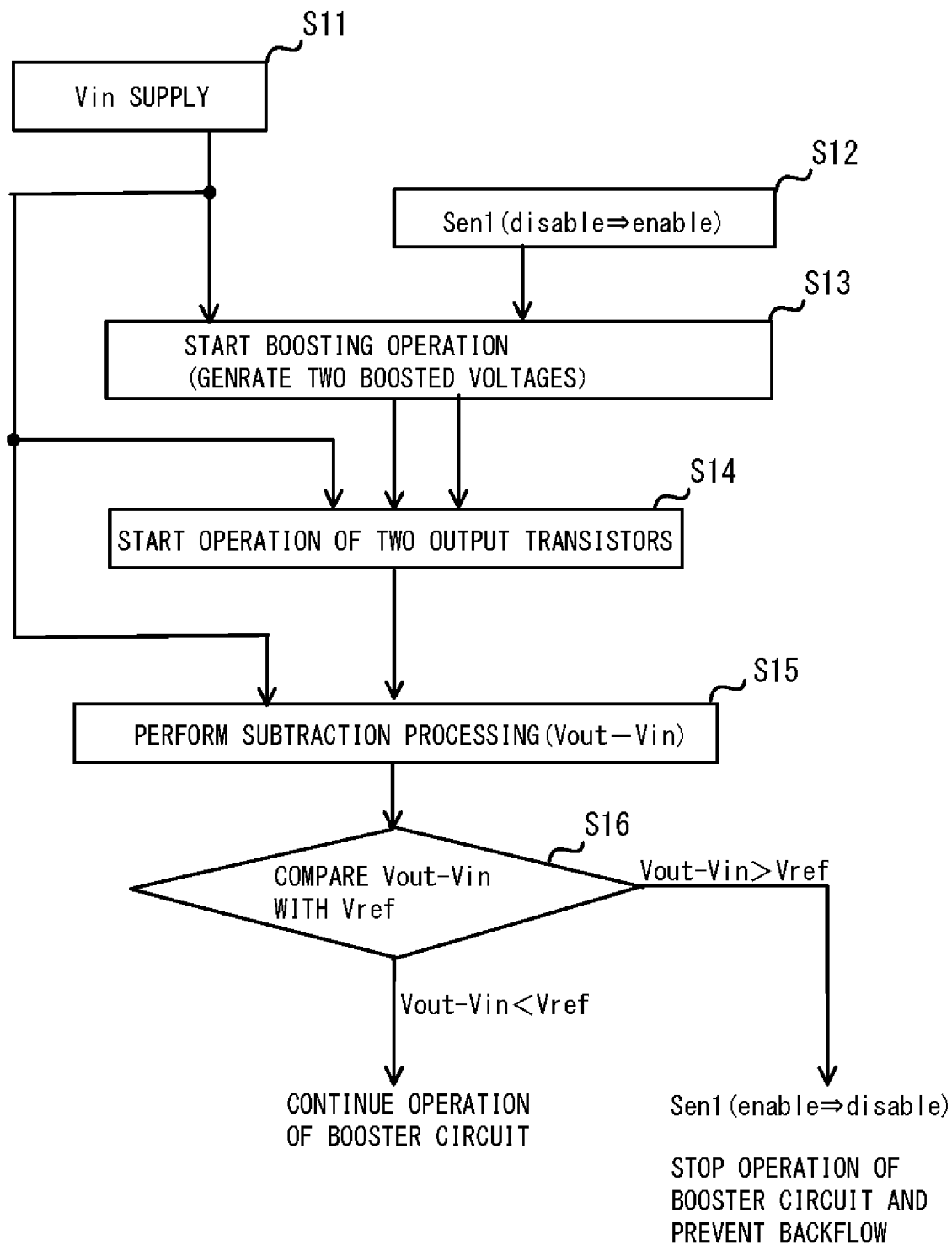
FIG. 11 is a flowchart illustrating an operation of the driver circuit according to the third embodiment.
Figure 12:
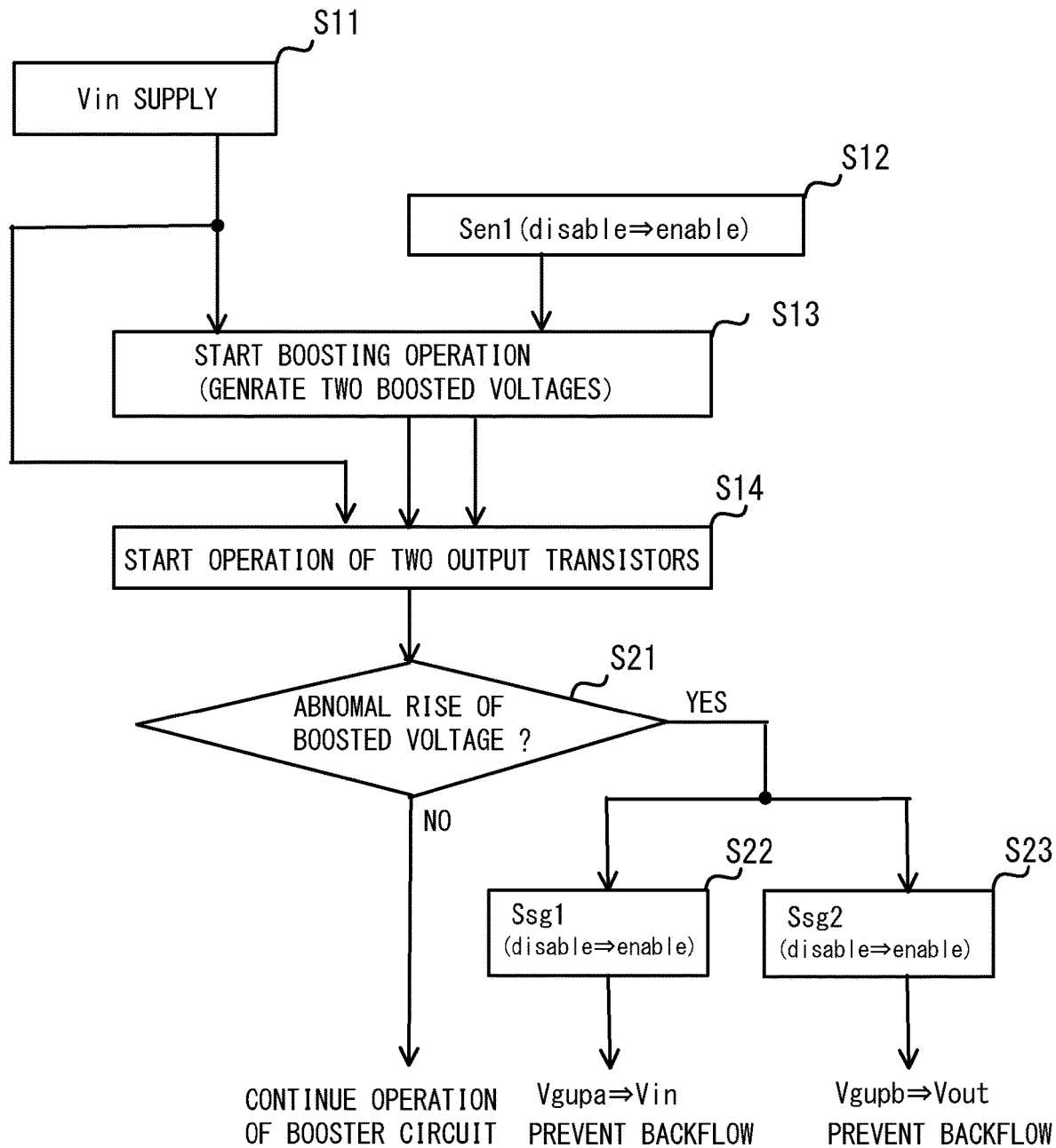
FIG. 12 is a flowchart illustrating an operation of the driver circuit according to the third embodiment.

Next, the operation of the driver circuit 400 will be described with reference to FIGS. 11 and 12. FIGS. 11 and 12 illustrate flowcharts showing the operation of the driver circuit, which show an example of backflow prevention.

As illustrated in FIG. 11, the driver circuit 400 is supplied with the input voltage Vin via the terminal Phigh (power supply terminal) (step S11).

Next, the control signal Sen1 outputted from the controller 1c to the input-voltage control circuit 3 changes from the disabled state (the low level) to the enabled state (the high level), and the control signal Sen1 in the enabled state (at the high level) makes the input-voltage control circuit 3 starts operating, turning on the MOS transistor PMT1 of the backflow prevention circuit 2. The input voltage Vin is outputted from the input-voltage control circuit 3 to the booster circuit 4a (step S12).

Next, the booster circuit 4a, receiving the input voltage Vin, starts the boosting operation. The booster circuit 4a outputs the boosted voltage Vgupa to the control terminal (gate) of the output transistor NMTout2 and outputs the boosted voltage Vgupb to the control terminal (gate) of the output transistor NMTout1 (step S13).

Next, the output transistor NMTout2 receives the boosted voltage Vgupa at the control terminal (gate) and turns on based on the boosted voltage Vgupa. At the same time, the output transistor NMTout1 receives the boosted voltage Vgupb at the control terminal (gate) and turns on based on the boosted voltage Vgupb to output the output voltage Vout to the output terminal Pout (step S14).

Next, while the driver circuit 400 keeps operating, the subtraction circuit 5a receives the input voltage Vin inputted via the terminal Phigh (power supply terminal) and the output voltage Vout and performs the subtraction processing to output the subtraction signal Sgn1 (step S15).

The comparator 6a receives the subtraction signal Sgn1 at the plus (+) port on the input side and the reference voltage Vref at the minus (−) port on the input side and performs a comparison calculation processing to output the comparison signal Shs1 to the control circuit 1c. The control circuit 1c compares the subtraction processing voltage (Vout−Vin) with the reference voltage Vref (step S16).

When the control circuit 1c determines that Vout−Vin is smaller than the reference voltage Vref, the control circuit 1b continues the operation of the booster circuit 4a. Specifically, the control circuit 1c determines that no problem has occurred and keeps supplying the control signal Sen1 in the enabled state (at the high level) to the input-voltage control circuit 3.

When the control circuit 1c determines that Vout−Vin is larger than the reference voltage Vref, the control circuit 1c stops the operation of the booster circuit 4a. Specifically, in the case where the control circuit 1c determines, for example, that the output voltage Vout has increased to a value larger than or equal to a specified value due to influence from the outside (influence from the power supply system or other components), the control circuit 1c switches the control signal Sen1 supplied to the input-voltage control circuit 3 from the enabled state (the high level) to the disabled state (the low level) to stop the operations of the input-voltage control circuit 3, the MOS transistor PMT1 of the backflow prevention circuit 2, and the booster circuit 4a. This operation prevents reverse current.

As illustrated in FIG. 12, in the operation of the driver circuit 400, steps S11 to S14 are the same as those in the operation illustrated in FIG. 11. Hence, description of those steps is omitted, and description will be made of the subsequent steps.

While the booster circuit 4a continues the boosting operation, and the driver circuit 400 keeps operating, the driver circuit 400 determines, for example, whether the boosted voltages Vgupa, Vgupb are abnormally high due to influence from the outside (influence from the power supply system or other components). To make the determination, it is checked whether a backflow current is flowing from the booster circuit 4a via the backflow prevention circuit 2 to the terminal Phigh (power supply terminal) side (step S21).

When it is determined that there is no backflow current, the control circuit 1c continues the boosting operation of the booster circuit 4a.

When a backflow current is detected, the control circuit 1c outputs the control signal Ssg1 in the enabled state (at the low level) to the control terminal (gate) of the MOS transistor PMT11 to turns on the MOS transistor PMT11 and thereby forcibly sets the node N11 to the input voltage Vin level (Vgupa→Vin). This operation prevents reverse current that would otherwise occur in the booster circuit 4a or at the node N11 (step S22).

At the same time, the control circuit 1c outputs the control signal Ssg2 in the enabled state (at the low level) to the control terminal (gate) of the MOS transistor PMT12 to turn on the MOS transistor PMT12 and thereby forcibly sets the node N12 to the output voltage Vout level (Vgupb→Vout). This operation prevents reverse current that would otherwise occur in the booster circuit 4a or at the node N12 (step S23).

After the node N11 has been set to the input voltage Vin level, the node N12 has been set to the output voltage Vout level, and it is determined that there is no backflow current, the control circuit 1c outputs the control signal Ssg1 in the disabled state (at the high level) to the control terminal (gate) of the MOS transistor PMT11 to turn off the MOS transistor PMT11 and outputs the control signal Ssg2 in the disabled state (at the high level) to the control terminal (gate) of the MOS transistor PMT12 to turn off the MOS transistor PMT12.

After turning off the MOS transistor PMT11 and the MOS transistor PMT12, the control circuit 1c determines that no problem has occurred and keeps supplying the control signal Sen1 in the enabled state (at the high level) to the input-voltage control circuit 3.

The driver circuit 400 of the third embodiment, as described above, includes the controller 1c, the backflow prevention circuit 2, the input-voltage control circuit 3, the booster circuit 4a, the subtraction circuit 5a, the comparator 6a, the MOS transistor PMT11, the MOS transistor PMT12, the body diode BD11, the body diode BD12, the terminal Phigh, and the terminal Plow. The output transistor NMTout2 and the output transistor NMTout1 are connected to each other in series, and the body diode BD5 of the output transistor NMTout2 and the body diode BD4 of the output transistor NMTout1 have a back-to-back structure. The subtraction circuit 5a receives the input voltage Vin and the output voltage Vout and performs the subtraction processing. The comparator 6a receives the subtraction processing voltage and the reference voltage Vref and performs the comparison calculation processing. The controller 1a, when the subtraction processing voltage is larger than reference voltage Vref, stops the operation of the input-voltage control circuit 3.

With this operation, the third embodiment not only provides the same effect as in the first embodiment but also is capable of stopping the operation of the driver circuit promptly when the output voltage Vout exceeds the input voltage Vin. In addition, in the case where the boosted voltage increases abnormally, the control circuit 1c turns on the MOS transistor PMT11 to forcibly set the boosted voltage Vgupa to the input voltage Vin and at the same time and turns on the MOS transistor PMT12 to forcibly set the boosted voltage Vgupb to the output voltage Vout, thus it is possible to promptly respond to an abnormal increase in the boosted voltage.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A driver circuit comprising:
an input voltage control circuit configured to output an input voltage when a control signal is in an enabled state, and interrupt the input voltage when the control signal is in a disabled state;
a backflow prevention circuit disposed between a power supply terminal and the input-voltage control circuit and including
a first transistor having a first terminal to which the input voltage is applied via the power supply terminal and a second terminal, the first transistor being configured to turn on to output the input voltage to the input-voltage control circuit when the control signal is in the enabled state, and turn off when the control signal is in the disabled state, and
a first body diode formed in the first transistor and having an anode connected to the first terminal of the first transistor and a cathode connected to the second terminal of the first transistor; and
a booster circuit configured to receive the input voltage outputted from the input-voltage control circuit, boost the input voltage to generate a boosted voltage, and supply the boosted voltage to a control terminal of an output transistor.

2. The driver circuit according to claim 1, further comprising:
a subtraction circuit configured to receive the input voltage inputted via the power supply terminal and the boosted voltage and perform a subtraction processing by subtracting the input voltage from the boosted voltage; and
a comparator configured to receive a subtraction processing voltage, generated by the subtraction processing of the subtraction circuit, at a plus port on an input side of the comparator and receive a reference voltage at a minus port on the input side of the comparator, and compare the subtraction processing voltage with the reference voltage.

3. The driver circuit according to claim 2, wherein
in a case where the subtraction-processed voltage is larger than the reference voltage, the control signal is changed from the enabled state to the disabled state to stop an operation of the input-voltage control circuit to turn off the first transistor.

4. The driver circuit according to claim 1, wherein
the first transistor is a P channel MOS transistor,
a back gate of the first transistor is connected to the second terminal of the first transistor, and
when the control signal is in the enabled state, a control terminal of the first transistor is set to a ground potential, and the first transistor operates.

5. The driver circuit according to claim 1, wherein
when the control signal is in the enabled state, the first transistor performs an unsaturated operation.

6. The driver circuit according to claim 1, wherein
when the control signal is in the disabled state, the first body diode functions as a backflow prevention diode to prevent current from flowing from the booster circuit side to the power supply terminal.

7. The driver circuit according to claim 1, wherein
the output transistor performs an unsaturated operation based on the boosted voltage.

8. The driver circuit according to claim 7, wherein
the output transistor outputs an output voltage via an output terminal.

9. The driver circuit according to claim 1, wherein
the input voltage control circuit includes
a first resistor having one end connected to the backflow prevention circuit and the other end connected to a control terminal of the first transistor,
a first MOS transistor having a first terminal connected to the other end of the first resistor, a second terminal, and a control terminal configured to receive the control signal,
a second MOS transistor having a first terminal connected to the backflow prevention circuit and the one end of the first resistor, a control terminal connected to the other end of the first resistor, and a second terminal from which the input voltage is supplied to the booster circuit, and
a first current source having one end connected to the second terminal of the first MOS transistor and the other end connected to a ground potential.

10. The driver circuit according to claim 9, wherein
the first MOS transistor is an N-channel MOS transistor, and the second MOS transistor is a P-channel MOS transistor.

11. A driver circuit comprising:
an input-voltage control circuit configured to output an input voltage when a control signal is in an enabled state, and interrupt the input voltage when the control signal is in a disabled state;
a backflow prevention circuit disposed between a power supply terminal and the input-voltage control circuit and including
a first transistor having a first terminal to which the input voltage is applied via the power supply terminal and a second terminal, the first transistor being configured to turn on to output the input voltage to the input voltage control circuit when the control signal is in the enabled state, and turn off when the control signal is in the disabled state, and
a first body diode formed in the first transistor and having an anode connected to the first terminal of the first transistor and a cathode connected to the second terminal of the first transistor; and
a booster circuit configured to receive the input voltage outputted from the input-voltage control circuit, boost the input voltage to generate a first boosted voltage and a second boosted voltage, and supply the first boosted voltage to a control terminal of a first output transistor and supply the second boosted voltage to a control terminal of a second output transistor connected to the first output transistor in series.

12. The driver circuit according to claim 11, further comprising:
a subtraction circuit configured to receive the input voltage inputted via the power supply terminal and receive an output voltage outputted from the second output transistor, and perform a subtraction processing by subtracting the input voltage from the output voltage; and
a comparator configured to receive a subtraction processing voltage, generated by the subtraction processing of the subtraction circuit, at a plus port on an input side of the comparator and receive a reference voltage at a minus port on the input side of the comparator, and compare the subtraction processing voltage with the reference voltage.

13. The driver circuit according to claim 11, wherein
in a case where the subtraction processing voltage is larger than the reference voltage, the control signal is changed from the enabled state to the disabled state to stop an operation of the input-voltage control circuit to turn off the first transistor.

14. The driver circuit according to claim 11, further comprising:
a second transistor having a first terminal to which the input voltage is applied via the power supply terminal, a second terminal to which the first boosted voltage is applied, and a control terminal, the second transistor being configured to, when the control terminal of the second transistor is in an enabled state, turn on and forcibly change the voltage of the second terminal of the second transistor from the first boosted voltage to the input voltage; and
a third transistor having a first terminal to which the second boosted voltage is applied and a second terminal to which the output voltage is applied, and a control terminal, the third transistor being configured to, when the control terminal of the third transistor is in an enabled state, turn on and forcibly change the voltage of the first terminal of the third transistor from the second boosted voltage to the output voltage.

15. The driver circuit according to claim 11, wherein
the first transistor is a P channel MOS transistor,
a back gate of the first transistor is connected to the second terminal of the first transistor, and
when the control signal is in the enabled state, a control terminal of the first transistor is set to a ground potential, and the first transistor operates.

16. The driver circuit according to claim 11, wherein
when the control signal is in the enabled state, the first transistor performs an unsaturated operation.

17. The driver circuit according to claim 11, further comprising:
a second body diode which is formed in the first output transistor and has an anode connected to a first terminal of the first output transistor and a cathode connected to a second terminal of the first output transistor; and a third body diode is formed in the second output transistor and has a cathode connected to a first terminal of the second output transistor and an anode connected to a second terminal of the second output transistor, wherein the second body diode and the third body diode form a back-to-back structure.

\* \* \* \* \*